United States Patent
Lee et al.

(10) Patent No.: US 7,211,515 B2
(45) Date of Patent: May 1, 2007

(54) METHODS OF FORMING SILICIDE LAYERS ON SOURCE/DRAIN REGIONS OF MOS TRANSISTORS

(75) Inventors: Young-Ki Lee, Gyeonggi-do (KR); Heon-Jong Shin, Gyeonggi-do (KR); Hwa-Sook Shin, Gyeonggi-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 460 days.

(21) Appl. No.: 10/388,354

(22) Filed: Mar. 13, 2003

(65) Prior Publication Data

US 2003/0183881 A1    Oct. 2, 2003

(30) Foreign Application Priority Data

Mar. 28, 2002   (KR) .................. 10-2002-0017088

(51) Int. Cl.
     *H01L 21/44*    (2006.01)
(52) U.S. Cl. .............. 438/682; 438/683; 438/303; 438/305; 257/E21.438
(58) Field of Classification Search .......... 438/163, 438/655, 656, 682, 683, 303, 305, 306; 257/408, 257/635, 636–638, 754, 755, 757, 768–770, 257/900, E21.438, E21.439
     See application file for complete search history.

(56) References Cited

U.S. PATENT DOCUMENTS 4,873,557 A * 10/1989 Kita ........................ 257/344
6,063,681 A * 5/2000 Son ......................... 438/303
6,084,280 A * 7/2000 Gardner et al. ............. 257/412
6,124,621 A * 9/2000 Lin et al. .................. 257/412
6,451,693 B1 * 9/2002 Woo et al. ................. 438/682

FOREIGN PATENT DOCUMENTS

| KR | 1998-029362 | 7/1998 |
| KR | 1999-0065455 | 8/1999 |

OTHER PUBLICATIONS

Notice to File a Response/Amendment to the Examination Report (Korean & English Translation) dated Mar. 31, 2004.

* cited by examiner

*Primary Examiner*—Minh-Loan Tran
(74) *Attorney, Agent, or Firm*—Myers Bigel Sibley & Sajovec, P.A.

(57) ABSTRACT

Methods of forming MOS transistors include forming lightly and heavily doped source/drain regions adjacent to one another in a substrate and a gate electrode with a sidewall spacer thereon. A salicide process is performed on a surface of the heavily doped source/drain region to provide a first suicide layer self-aligned to the sidewall spacer. At least a portion of the sidewall spacer is removed to expose a portion of the lightly doped source/drain region adjacent to the first silicide layer. A salicide process in performed on the exposed portion of the lightly doped source/drain region to provide a second silicide layer adjacent to the first suicide layer. Related devices are also disclosed.

28 Claims, 18 Drawing Sheets

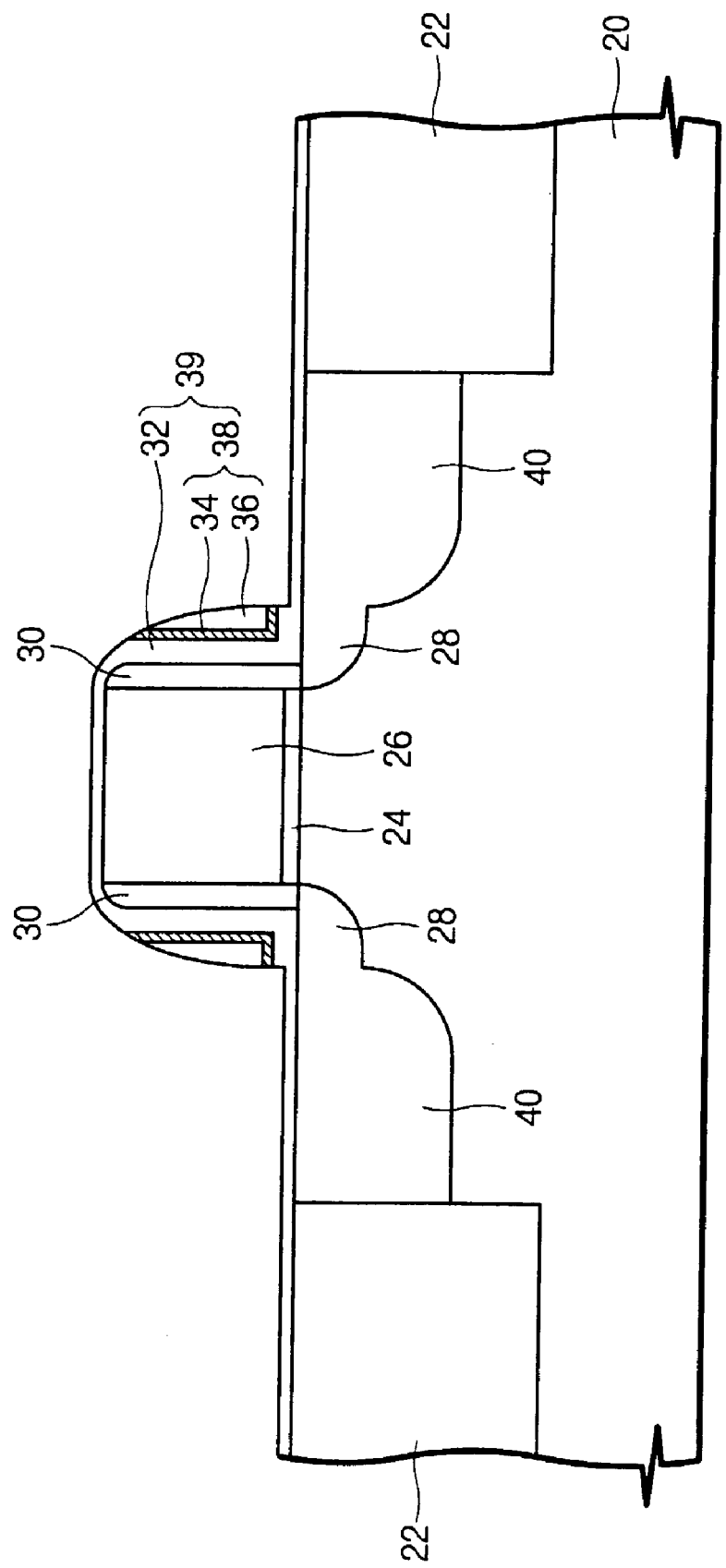

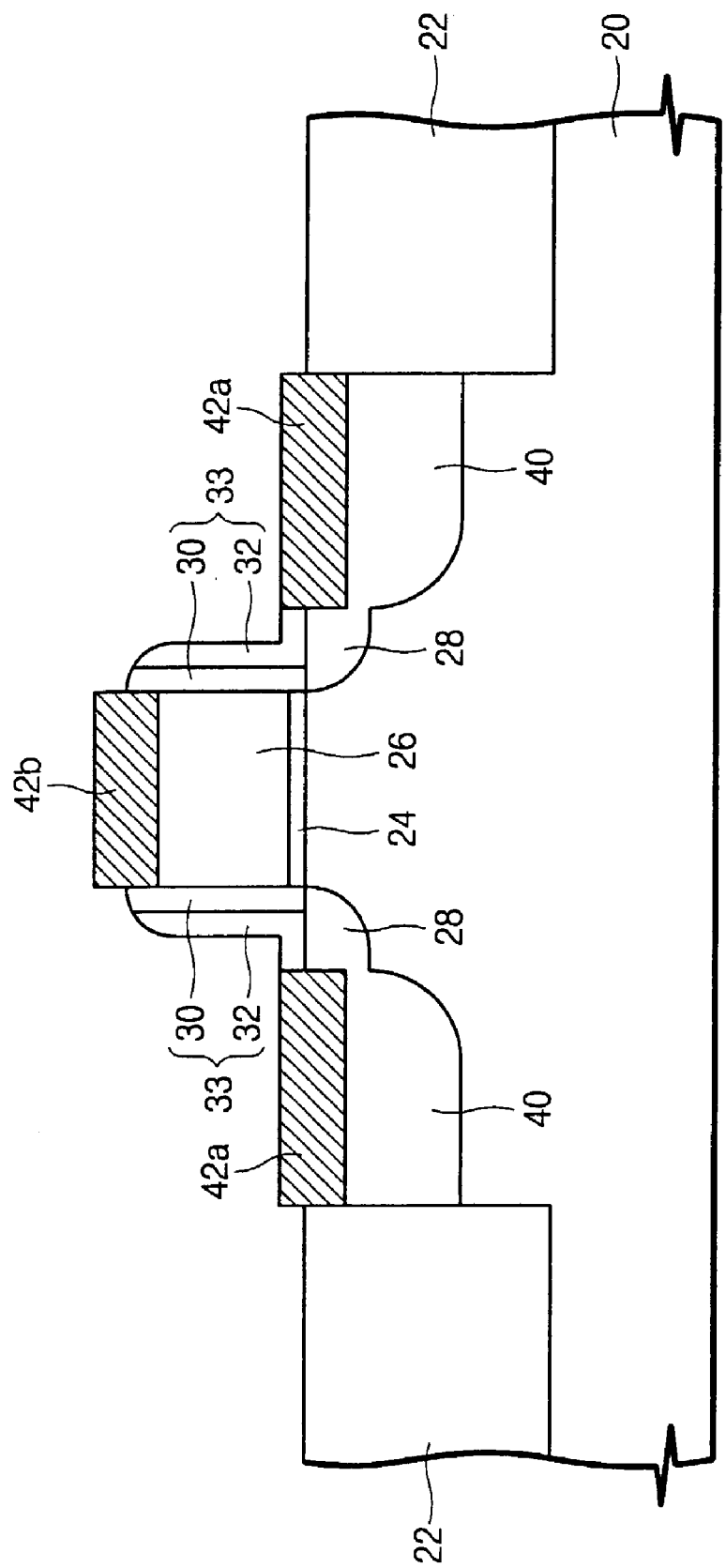

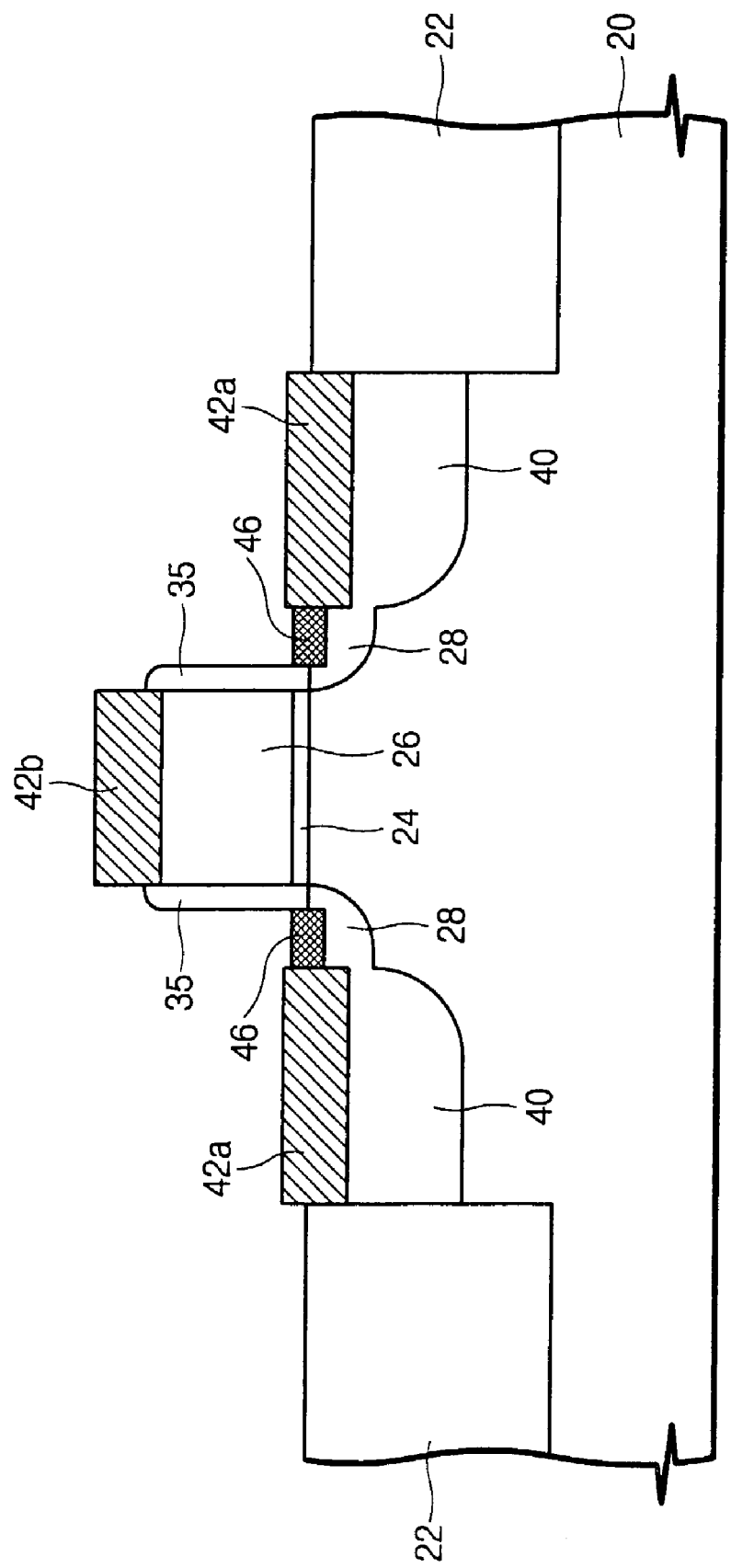

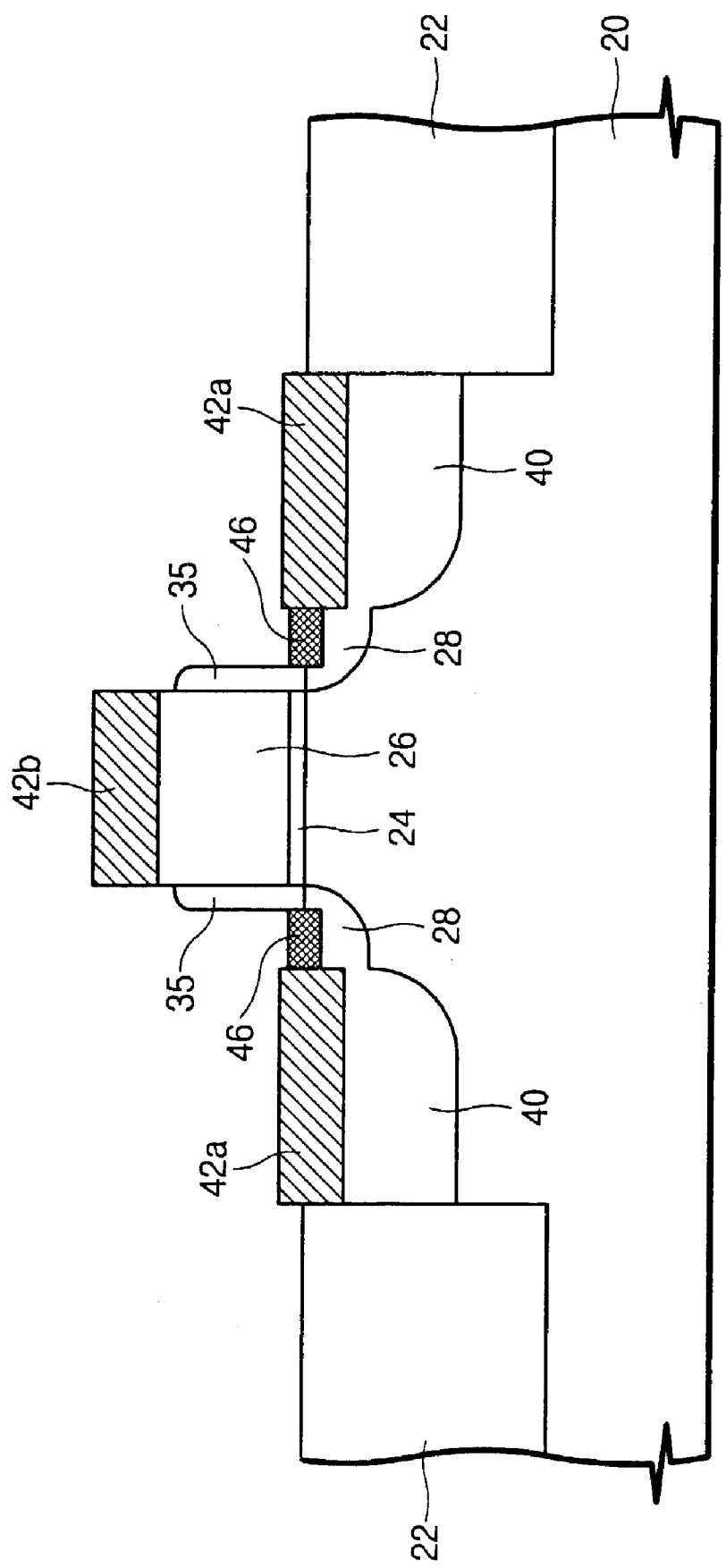

METHODS OF FORMING SILICIDE LAYERS ON SOURCE/DRAIN REGIONS OF MOS TRANSISTORS

RELATED APPLICATION

This application relies for priority upon Korean Patent Application No. 2002-17088, filed on Mar. 28, 2002, the contents of which are herein incorporated by reference in their entirety.

FIELD OF THE INVENTION

The present invention relates to Metal-Oxide-Semiconductor (MOS) transistors and methods of fabricating the same in general and, more specifically, to MOS transistors having silicided source/drain regions and methods of fabricating the same.

BACKGROUND

Self-aligned silicide (Salicide) processes have been widely used to lower resistances of gate and source/drain regions of transistors. Generally, a Salicide process is a method of simultaneously forming a silicide layer on a polysilicon gate electrode and on an active region of a silicon substrate. A Salicide process can lower the contact resistance and the sheet resistance.

FIG. 1 is a cross-sectional view illustrating a conventional MOS transistor having a lightly doped drain (LDD) region. Referring to FIG. 1, field regions 4 are formed on a semiconductor substrate 2 to define an active region therebetween. A gate stack, including a gate insulation layer 6, a gate electrode 8, and a gate silicide layer 16a, are formed on a predetermined region of the active region. A gate spacer 12 is formed on both sidewalls of the gate stack. A lightly doped region 10 is formed in the semiconductor substrate 2 under the gate spacer 12 by, for example, implanting ions into the substrate 2 prior to formation of the gate spacer 12. A heavily doped region 14 is formed in the active region of the semiconductor substrate 2 adjacent to the gate spacer 12. A silicide layer 16b is formed on a surface of the heavily doped region 14.

The lightly doped region 10 can be self-aligned to the gate stack between a channel region that underlies the gate stack and the heavily doped region 14. The lightly doped region 10 allows an electric field between the source/drain region and the channel region to be decreased which may prevent or reduce the rapid acceleration of carriers emitted from the source (i.e., hot carrier effects).

SUMMARY

Embodiments according to the present invention can provide methods of forming MOS transistors including silicide layers and devices so formed. Pursuant to these method embodiments, lightly and heavily doped source/drain regions can be formed adjacent to one another in a substrate having a gate electrode with a sidewall spacer thereon. A salicide process can be performed on a surface of the heavily doped source/drain region to provide a first silicide layer self-aligned to the sidewall spacer. At least a portion of the sidewall spacer can be removed to expose a portion of the lightly doped source/drain region adjacent to the first silicide layer. A salicide process is performed on the exposed portion of the lightly doped source/drain region to provide a second silicide layer between the first silicide layer and the gate electrode.

In some embodiments according to the present invention, an I-shaped sidewall spacer can be on the gate electrode and an L-shaped sidewall spacer can be formed to include a first portion on the I-shaped sidewall spacer having a base portion on the substrate and a second portion that extends on the substrate from the base away from the gate electrode. In some embodiments according to the present invention, the step of removing at least a portion of the sidewall spacer comprises removing the L-shaped spacer. In some embodiments according to the present invention, the first and second silicide layers comprise separate silicide layers.

In some embodiments according to the present invention, the step of forming lightly and heavily doped source/drain regions is preceded by: forming the lightly doped source/drain region in the substrate self-aligned to the gate electrode, forming a first spacer on a sidewall of the gate electrode, forming a second spacer on the first spacer, and forming the heavily doped source/drain region in the substrate self-aligned to the second spacer.

In some embodiments according to the present invention, the first and second silicide layers form a continuous silicide layer on the heavily doped source/drain region and on the lightly doped source/drain region. In some embodiments according to the present invention, the second silicide layer has a thickness less than that of the first silicide layer.

In some embodiments according to the present invention, forming a MOS transistor can include forming lightly and heavily doped source/drain regions adjacent to one another in a substrate having a gate electrode with a sidewall spacer thereon. A first silicide layer can be formed having a first thickness on the heavily doped source/drain region self-aligned to the sidewall spacer and a second silicide layer is formed having a second thickness, less than the first thickness, on the lightly doped source/drain region adjacent to the first silicide layer. In some embodiments according to the present invention, a surface of the first silicide layer extends beyond a surface of the second silicide layer.

In accordance with aspects of the present invention, provided is a method of fabricating a MOS transistor comprising forming a field region at a semiconductor substrate to define an active region, then patterning a gate electrode over the active region. At this time, a gate insulation layer is intervened between the active region and the gate electrode. By using the gate insulation layer and the field region as an ion implantation mask, a lightly doped region is formed in the active region. A gate spacer, which is formed by sequentially stacking and patterning an inner insulation layer and an outer insulation layer, is formed on sidewalls of the gate electrode. A heavily doped region is formed in the active region by using the gate spacer and the field region as an ion implantation mask. The patterned outer insulation layer is removed to form an L-shaped spacer on the sidewalls of the gate electrode. The L-shaped spacer includes an I-shaped main portion and a projected portion extended from a bottom of the main portion. A first silicide layer is formed on the heavily doped region adjacent to the L-shaped spacer, and the projected portion of the L-shaped spacer is removed to expose a partial surface of the lightly doped region. A second silicide layer, which is formed to a thinner thickness than the first silicide layer, is formed on the exposed lightly doped region.

In accordance with another aspect of the present invention, provided is a MOS transistor comprising a semiconductor substrate and a field region formed at the semiconductor substrate to define an active region. A gate electrode is formed over the active region, and a gate insulation layer is intervened between the active region and the gate electrode. An I-shaped spacer is formed on sidewalls of the gate electrode. A lightly doped region and a heavily doped region are formed in the semiconductor substrate adjacent to the gate electrode. A first silicide layer is formed on a surface of the heavily doped region. A second silicide layer, which is thinner than the first silicide layer, is formed on the lightly doped region between the I-shaped spacer and the first silicide layer.

BRIEF DESCRIPTION OF THE DRAWINGS

FIGS. 3A to 3H are cross-sectional views illustrating methods of fabricating MOS transistors including an extended silicide layer on a source/drain region according to embodiments of the present invention.

FIGS. 4A to 4H are cross-sectional views illustrating methods of fabricating MOS transistors including an extended silicide layer on a source/drain region according to embodiments of the present invention.

DESCRIPTION OF EMBODIMENTS ACCORDING TO THE PRESENT INVENTION

Figure 1:
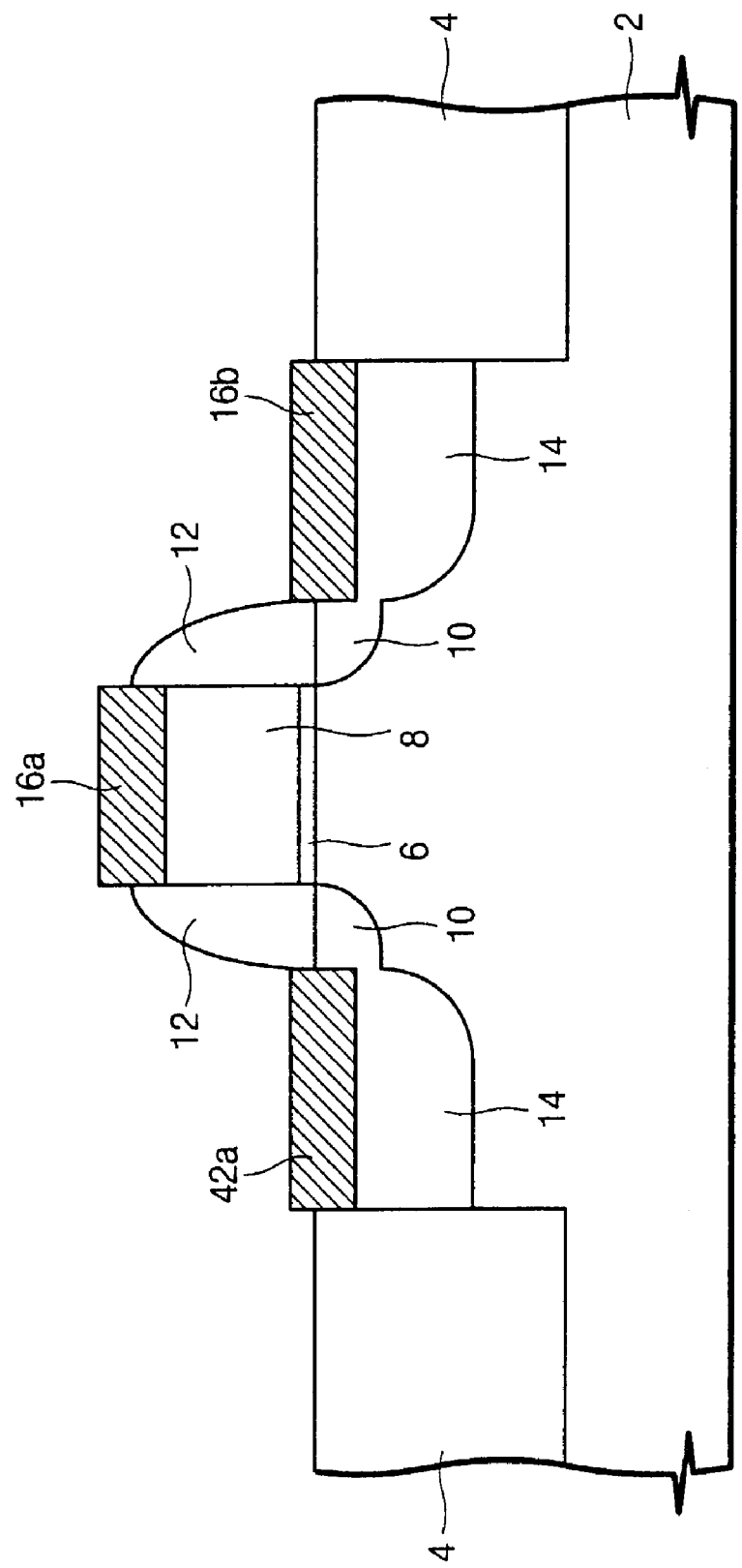
FIG. 1 is a cross-sectional view illustrating a conventional MOS transistor with an LDD structure.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be directly on the other element or intervening elements may also be present.

Furthermore, relative terms, such as "beneath", may be used herein to describe one element's relationship to another element as illustrated in the Figures. It will be understood that relative terms are intended to encompass different orientations of the device in addition to the orientation depicted in the Figures. For example, if the device in the Figures is turned over, elements described as "below" other elements would then be oriented "above" the other elements. The exemplary term "below", can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention. Like numbers refer to like elements throughout.

Figure 2:
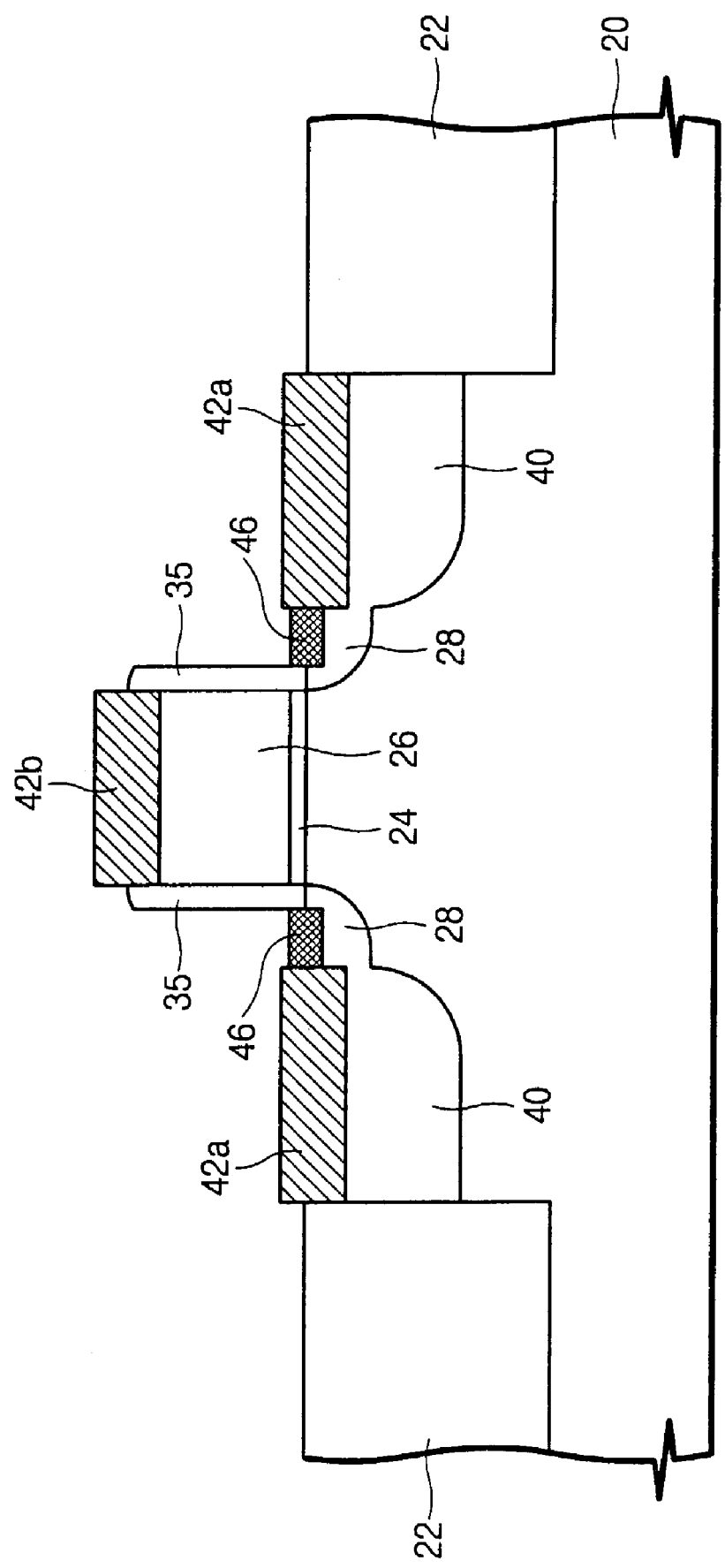
FIG. 2 is a cross-sectional view illustrating MOS transistors including a silicide layer on a lightly doped region according to embodiments of the present invention.

FIG. 2 illustrates a configuration of a MOS transistor in which a silicide layer is formed on a surface of a lightly doped region according to embodiments of the present invention. Referring to FIG. 2, a field region 22 is formed in a substrate 20 to define an active region. A gate insulation layer 24 is formed on the active region and a gate electrode 26 is formed on the gate insulation layer 24. A lightly doped region 28 is formed in the substrate 20 self-aligned to the gate electrode 26. An I-shaped spacer 35 is formed on both sidewalls of the gate electrode 26. A heavily doped region 40 is formed in the substrate 20 on both sides of and adjacent to the gate electrode 26. A first silicide layer 42a is formed on a surface of the heavily doped region 40. A gate suicide layer 42b is formed on the gate electrode 26. A second silicide layer 46 is formed on a portion of the lightly doped region 28. In some embodiments according to the present invention, the second silicide layer 46 is formed thinner than the first silicide layer 42a.

The foregoing structure can allow formation of the silicide layer on the surface of the lightly doped region 28. Thus, the resistance of contacts thereon may be reduced to improve the speed of the device. The I-shaped spacer 35 can prevent an electric short between the gate electrode 26 and the impurity regions 28 and 40. In contrast to embodiments according to the present invention, a gate spacer used to form an LDD region in a conventional structure may prevent the formation of silicide on the LDD region which could prevent further reductions in the resistance. While the length of the gate electrode may be shortened as the associated design rule for the device is reduced, using conventional approaches it may be difficult to correspondingly increase the area of the silicide layer by reducing the width of the gate spacer 12 as to do so may promote lateral diffusion of impurities in the source/drain region.

Methods of fabricating embodiments according to the present invention will be described with reference to the drawings. FIGS. 3A to 3H are cross-sectional views illustrating methods of fabricating MOS transistors including an extended silicide layer on a source/drain region according to embodiments of the present invention.

Figure 3A:
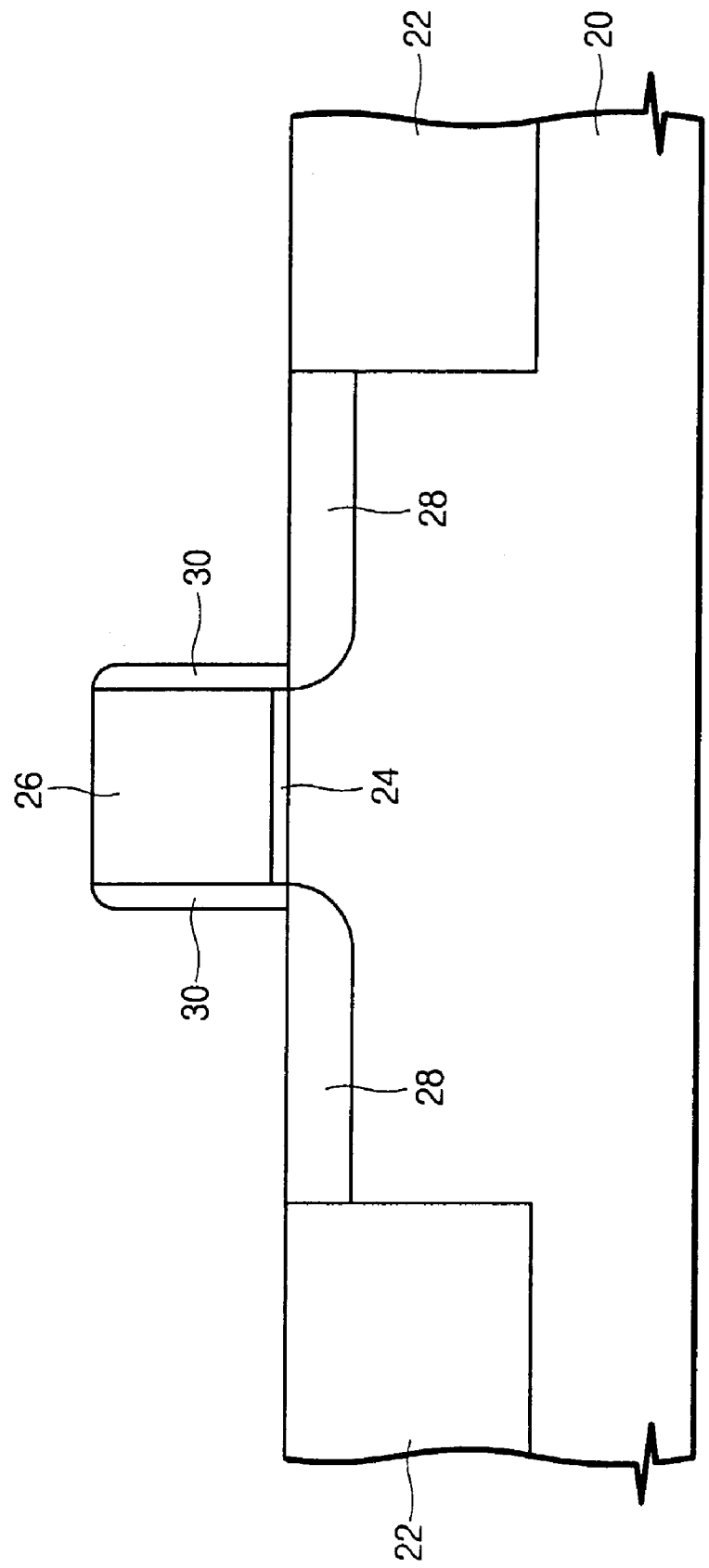

Referring to FIG. 3A, field regions 22 are formed on the substrate 20 to define an active region therebetween. The substrate 20 is etched to form a trench that is filled with an insulating material. The insulating material is polished using, for example CMP, to form the field regions 22.

An insulation layer and a conductive layer for a gate electrode are formed on the substrate 20 and then patterned to form a gate insulation layer 24 and a gate electrode 26. The conductive layer for the gate electrode can be formed of silicon germanium (SiGe), cobalt (Co), tungsten (W), titanium (Ti), nickel (Ni), tantalum (Ta), titanium nitride (TiN), tantalum nitride (TaN), and tungsten nitride (WN), in addition to impurity-doped polysilicon. Impurity ions are implanted into the active region at a low concentration using the gate electrode 26 and the field region 22 as an ion implantation mask, to form a lightly doped region 28. In some embodiments according to the present invention, a thin insulation layer is formed on the substrate 20 and the gate electrode 26. The insulation layer is etched to form an insulating spacer 30. The insulating spacer 30 can be a silicon oxide layer. In some embodiments according to the present invention, the lightly doped region 28 can be formed after the insulating spacer 30 is formed, using for example, diffusion.

Figure 3B:
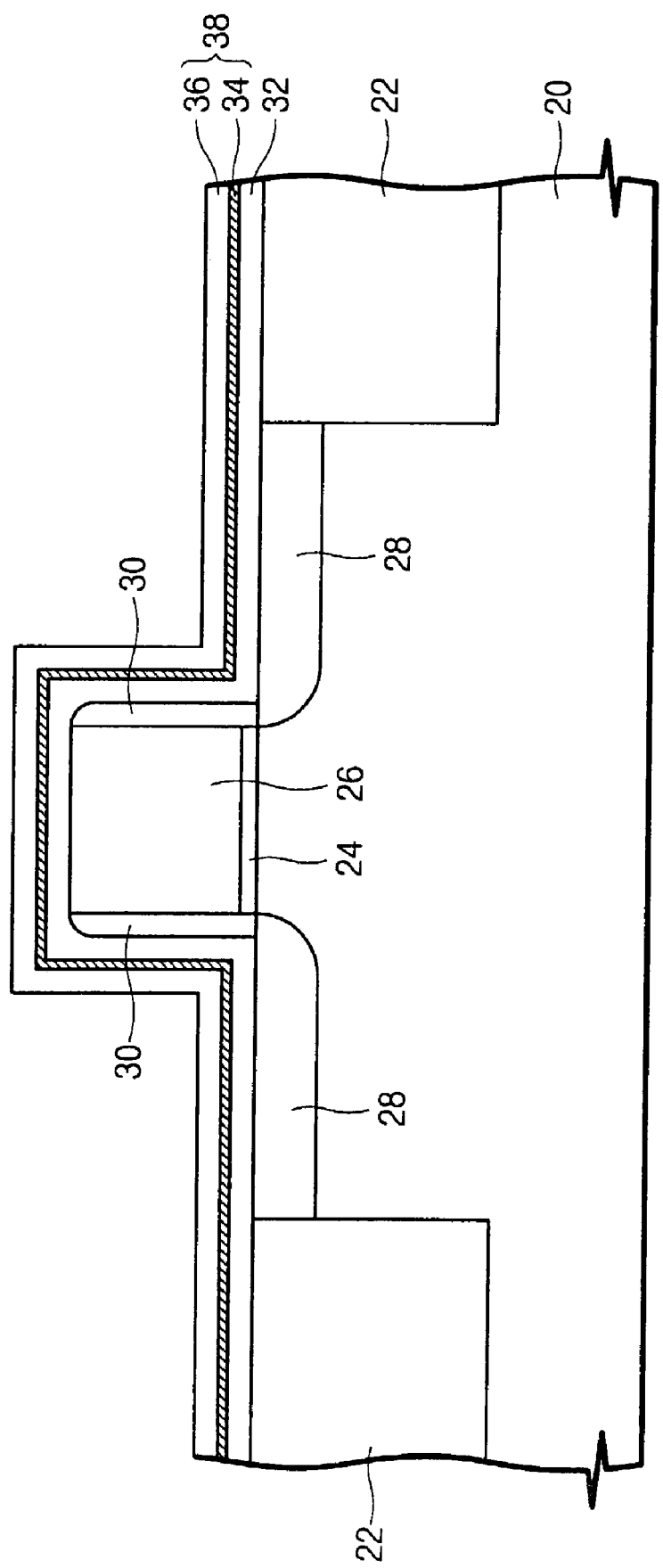

Referring to FIG. 3B, an inner insulation layer 32 and an outer insulation layer 38 are sequentially formed on the substrate. The inner insulation layer 32 can be formed of a silicon oxide layer. The outer insulation layer 38 can be formed of a first outer insulation layer 34 and a second outer insulation layer 36. In some embodiments according to the present invention, the first and second outer insulation layers 34 are formed of materials having different etch rates. For example, the first outer insulation layer 34 can be a silicon nitride layer and the second outer insulation layer 36 can be a silicon oxide layer. In some embodiments according to the present invention, the first outer insulation layer 34 is thinner than the inner insulation layer 32.

Referring to FIG. 3C, the inner and outer insulation layers 32 and 38 are patterned by dry etching using an anisotropic etch process, to form a gate spacer on the sidewalls of the insulating spacer 30. The gate spacer 39 includes the patterned inner insulation layer 32 and the patterned outer insulation layer 38. The patterned outer insulation layer 38 includes the patterned first outer insulation layer 34 and the patterned second outer insulation layer 36. In some embodiments according to the present invention, the dry etching is carried out such that the inner insulation layer 32 is not completely etched so that a remaining portions has a thickness of about 50 Ångstroms.

The heavily doped region 40 is formed by ion implantation using the gate electrode 26, the insulating spacer 30, the gate spacer 39, and the field region 22 as an ion implantation mask. The inner insulation layer 32 remaining on the substrate can provide a buffer layer during the high-concentration ion implantation process.

Figure 3D:
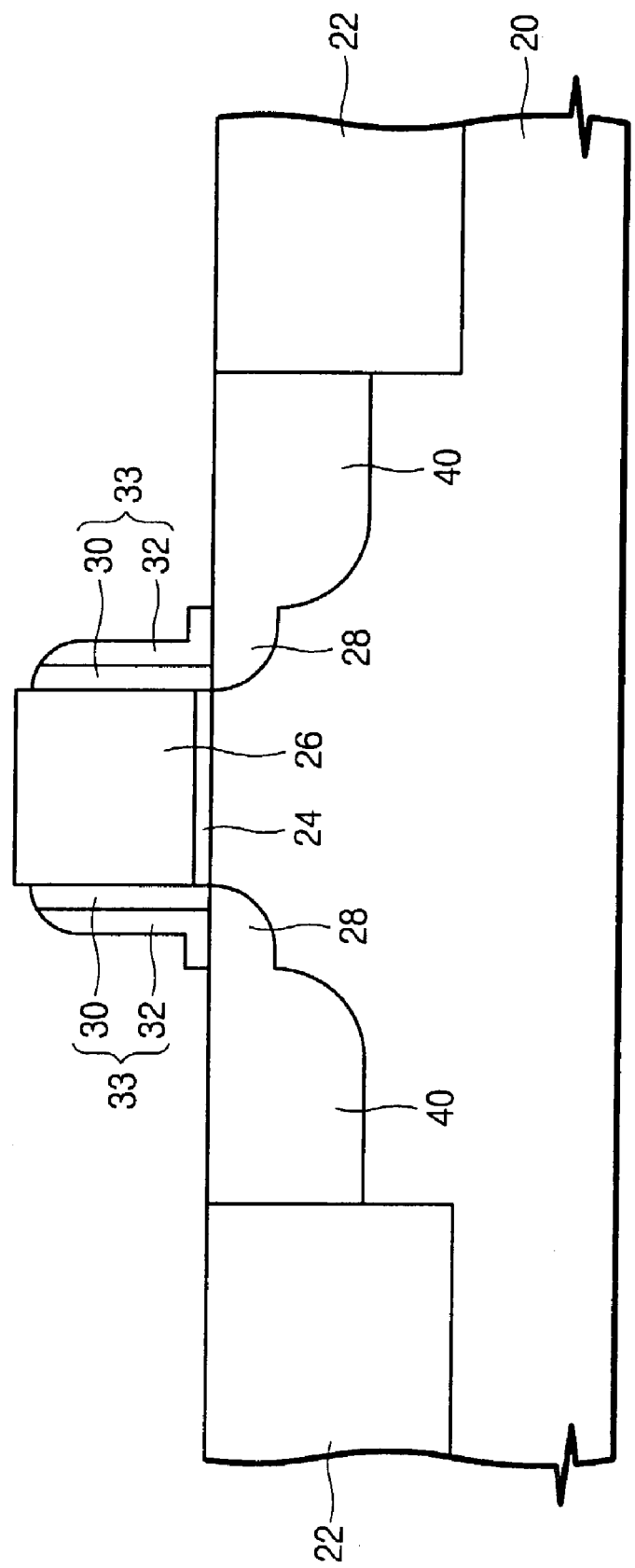

Referring to FIG. 3D, the patterned outer insulation layer 38 (constituting the gate spacer 39) is removed using a wet etch process, thereby forming an L-shaped spacer 33 of the insulating spacer 30 and the patterned inner insulation layer 32. The L-shaped spacer 33 includes an I-shaped portion adjacent to the sidewall of the gate electrode 26 and a projected portion that extends from a bottom (or base) of the I-shaped portion away from the sidewall of the gate electrode 26.

In embodiments according to the present invention where the first outer insulation layer 34 is a silicon nitride layer and the patterned second outer insulation layer 36 is a silicon oxide layer, the patterned second outer insulation layer 36 is removed using a buffered oxide etchant (BOE), whereas the patterned first outer insulation layer 34 is removed with a wet etching using a phosphoric acid (such as $H_3PO_4$). As mentioned above, the first outer insulation layer 34 can be thinner than the inner insulation layer 32 which may promote formation of the L-shaped spacer 33 to have the desired shape.

In some embodiments according to the present invention, a thin layer of about 50 Ångstroms of the inner insulation layer 32 may remain on the substrate after the wet etching to act as a buffer layer to protect the substrate. The remaining layer of the inner insulation layer 32 may also prevent wet etching of the projected portion at the base of the L-shaped spacer 33.

Referring to FIG. 3E, a Salicide process is applied to a surface of the heavily doped region 40 and to a top of the gate electrode 26, thereby forming a first silicide layer 42a on the heavily doped region 40 and a gate silicide layer 42b. In some embodiments according to the present invention, a silicide layer may not be formed on the gate electrode 26 depending on the material constituting the gate electrode 26. The first silicide layer 42a and the gate silicide layer 42b may be selected from the group consisting of cobalt (Co), titanium (Ti), nickel (Ni), tungsten (W), platinum (Pt), hafnium (Hf), and palladium (Pd). Embodiments according to the present invention, including cobalt as the silicide layer will be described herein in greater detail.

A wet cleaning process is carried out to remove a natural oxide layer on a surface of the heavily doped region 40 and on a surface of the gate electrode 26. A cobalt layer is deposited using, for example, sputtering. A cobalt monosilicide (CoSi) is formed by a first thermal process. The first thermal process is carried out at a temperature in a range between about 400° C. and about 600° C. in a conventional rapid thermal annealer. This can cause a silicide reaction in regions where the cobalt contacts silicon. The regions of the substrate having the silicide reaction are cleaned using a mixed solution of sulfuric acid ($H_2SO_4$), oxygenated water ($H_2O_2$), and water ($H_2O$). Thus, the unsilicided cobalt layer can be removed. A second thermal process is carried out at a temperature of about 750° C. or higher. The second thermal process can promote the cobalt monosilicide (CoSi) to change phase to cobalt disilicide ($CoSi_2$) which can have a low resistivity.

In some embodiments according to the present invention, the silicide layer may be formed using a one-step thermal process. For example, a cobalt layer can be formed and then annealed at about 750° C. or higher. Thereafter, a cleaning process is carried out to remove the unreacted metal, thereby forming the silicide layer.

Figure 3F:
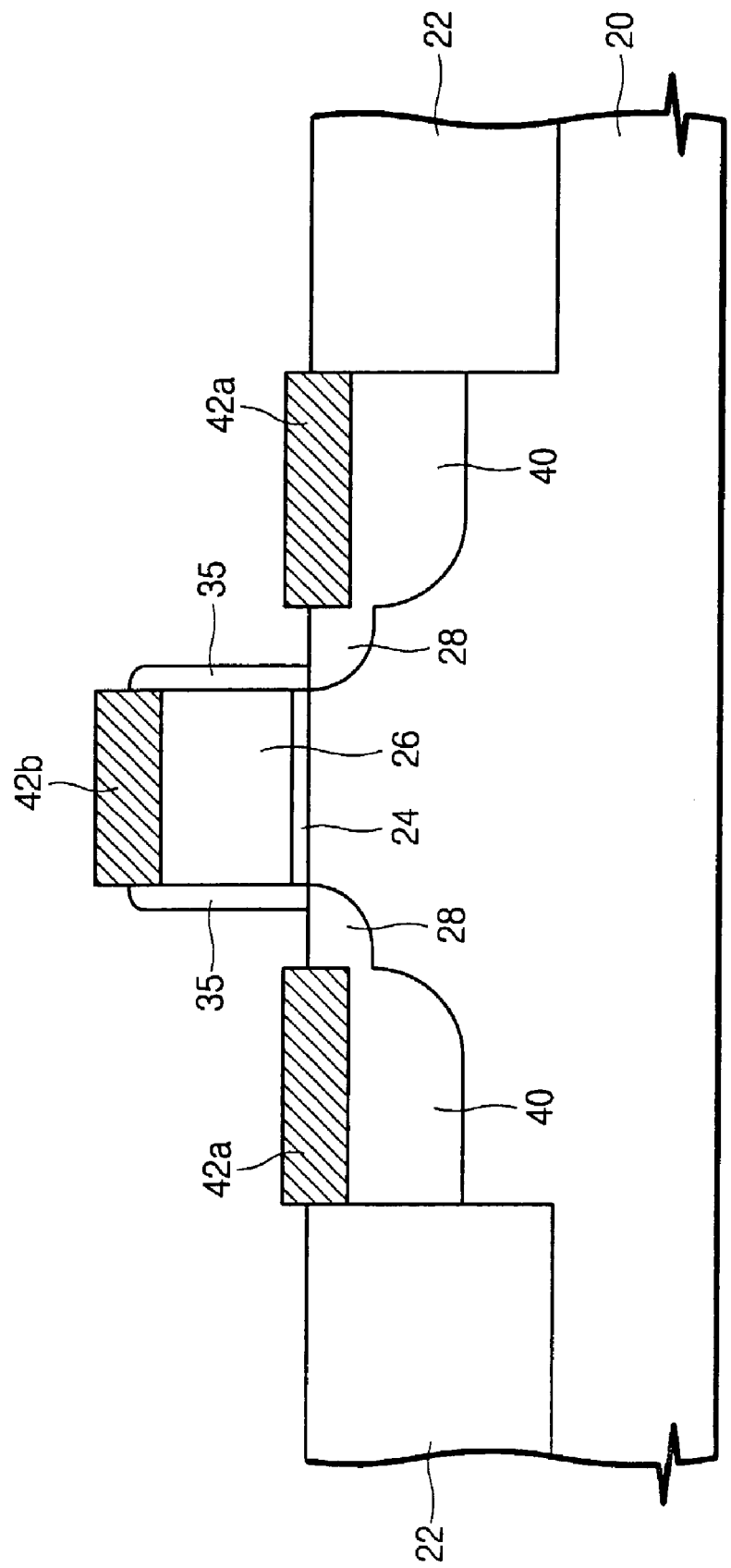

Referring to FIG. 3F, the inner insulation layer 32 is at least partially removed using wet etching to remove the portion of the L-shaped spacer 33 that projects from the base, to expose a surface of the lightly doped region 28. Therefore, the I-shaped spacer 35 remains on the sidewalls of the gate electrode 26, but the portion of the L-shaped spacer 33 that projects from the base is removed. The I-shaped spacer 35 may be formed of only the insulating spacer 30 or a combination of the insulating spacer 30 and a portion of the inner insulation layer 32.

Figure 3G:
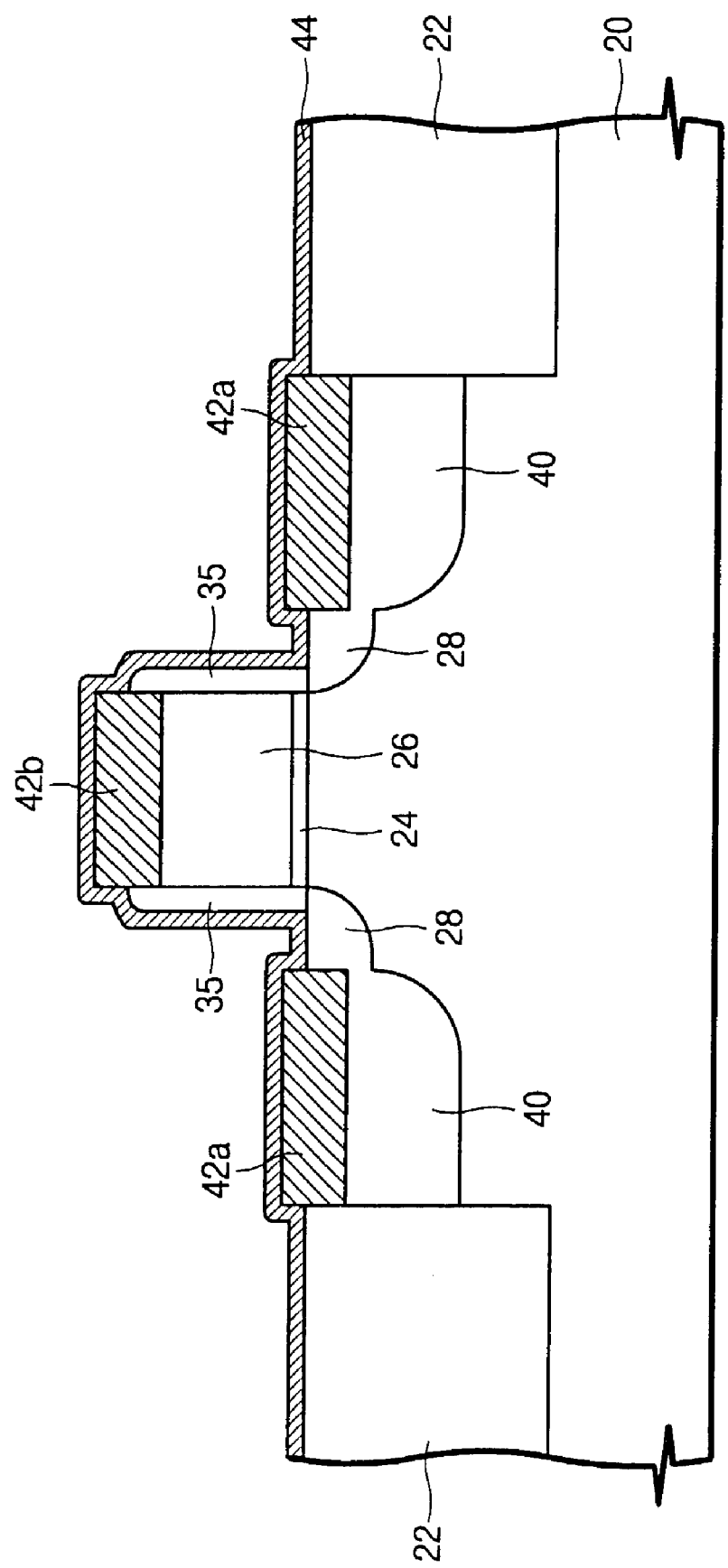

Referring to FIG. 3G, a thin metal layer 44 is formed on the gate electrode 26, the sidewalls of the gate electrode 26, and the substrate. The metal layer 44 may be the same material described above as part of the Salicide process and may be formed by sputtering. In some embodiments according to the present invention, a natural silicide layer is formed via a natural reaction rather than via the thermal process described above. The natural silicide layer can be formed, for example, by a thermodynamic reaction generated when two different materials are brought into proximity with one another. In particular, when two materials are brought into proximity with one another they may diffuse into each other and can mixed at an interface therebetween. For example, it is known that cobalt (Co) reacts on silicon at an interface therebetween and creates cobalt monosilicide (CoSi) layer having a thickness of about 30 Ångstroms. A cleaning process is carried out to remove metal that did not react with the silicon substrate.

Referring to FIG. 3H, a thin second silicide layer 46 is formed on the exposed lightly doped region 28. Furthermore, in the case of cobalt, cobalt monosilicide (CoSi) may be changed in phase to cobalt disilicide ($CoSi_2$) by a thermal process so as to lower resistance. The second silicide layer 46 is thinner than the first silicide layer 42a formed on the heavily doped region 40. This is because if the second silicide layer 46 were too thick, the junction formed between the impurity regions 28 and 40 and the substrate 20 may be degraded thereby causing an increase in leakage current. Accordingly, the surface of the first silicide layer 42a extends beyond the adjacent surface of the second silicide layer 46. In other words, the upper surface of the first silicide layer 42a is higher than the adjacent upper surface of the second silicide layer 46. Furthermore, the lower surface of the first silicide layer 42a is lower than the adjacent lower surface of the second silicide layer 46.

The I-shaped spacer 35 remaining on the sidewalls of the gate electrode 26 prevents an electric short between the gate electrode 26 and the impurity regions 28 and 40 due to the second silicide layer 46.

Figure 4A:
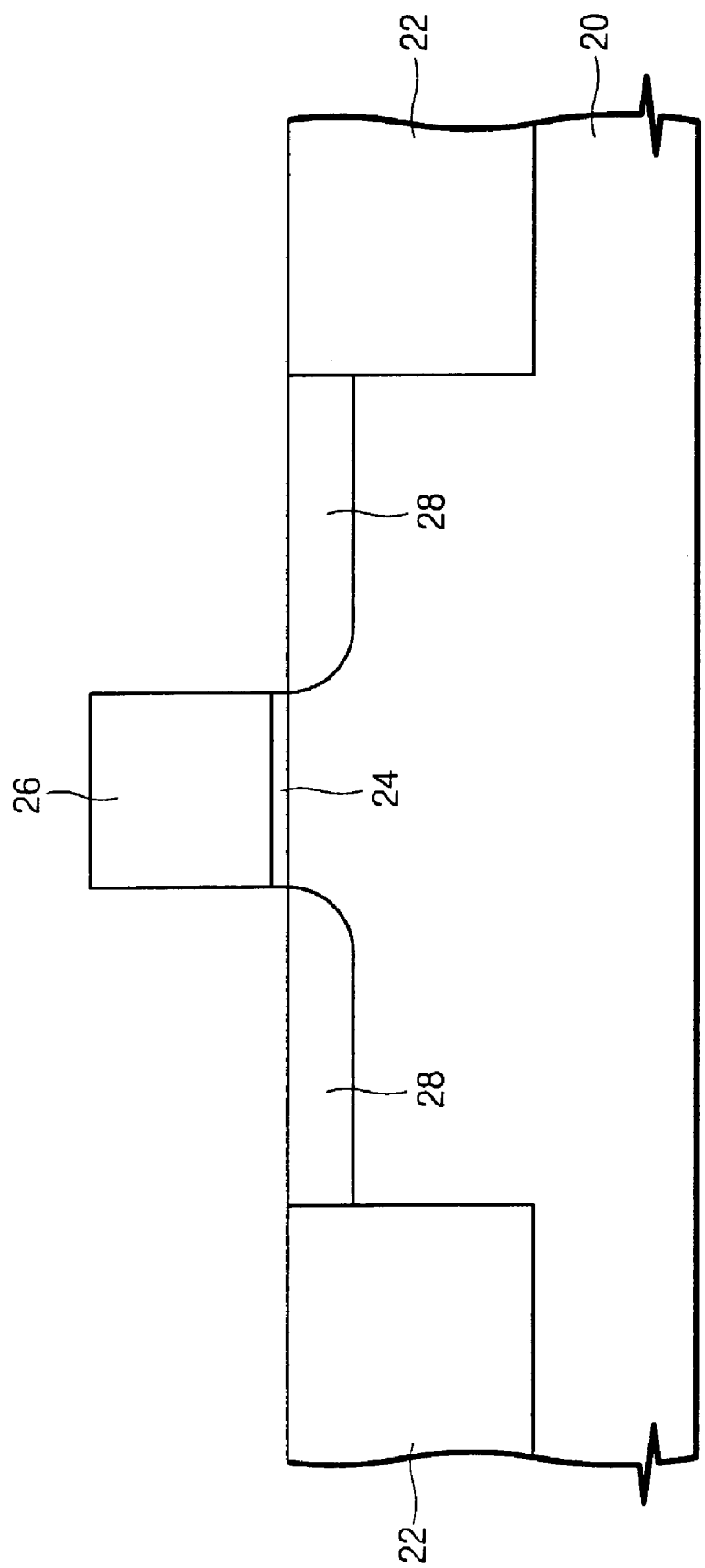

FIGS. 4A to 4H are cross-sectional views illustrating methods of fabricating MOS transistors having an extended silicide layer on a source/drain region according to other embodiments of the present invention. Referring to FIG. 4A, the field regions 22 are formed on the semiconductor substrate 20 to define an active region therebetween. An insulation layer and a conductive layer are formed on a surface of the substrate and patterned to form a gate insulation layer 24 and the gate electrode 26. Impurities are implanted, using the gate electrode 26 and the field region 22 as an ion implantation mask, into the active region at a low concentration to form a lightly doped region 28.

Figure 4B:
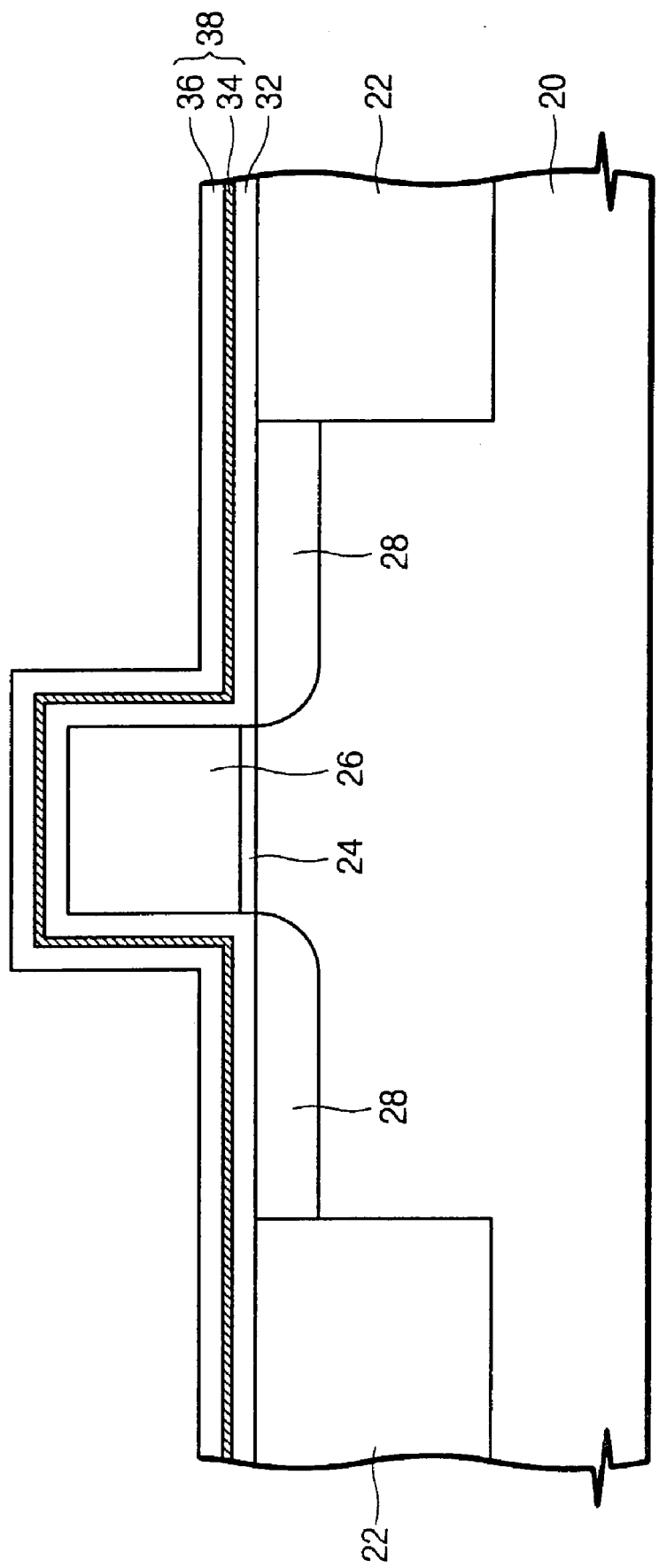

Referring to FIG. 4B, an inner insulation layer 32 and an outer insulation layer 38 are sequentially formed on the surface of the substrate and on the gate electrode 26. In some embodiments according to the present invention, the inner insulation layer 32 is a silicon oxide layer. In some embodiments according to the present invention, the outer insulation layer 38 includes a first outer insulation layer 34 and a second outer insulation layer 36 as disclosed above, for example, in reference to FIG. 3B. In some embodiments according to the present invention, the first and second outer insulation layers 34 and 36 are materials having different etch rates. For example, the first outer insulation layer 34 can be a silicon nitride layer, while the second outer insulation layer 36 can be a silicon oxide layer.

Figure 4C:
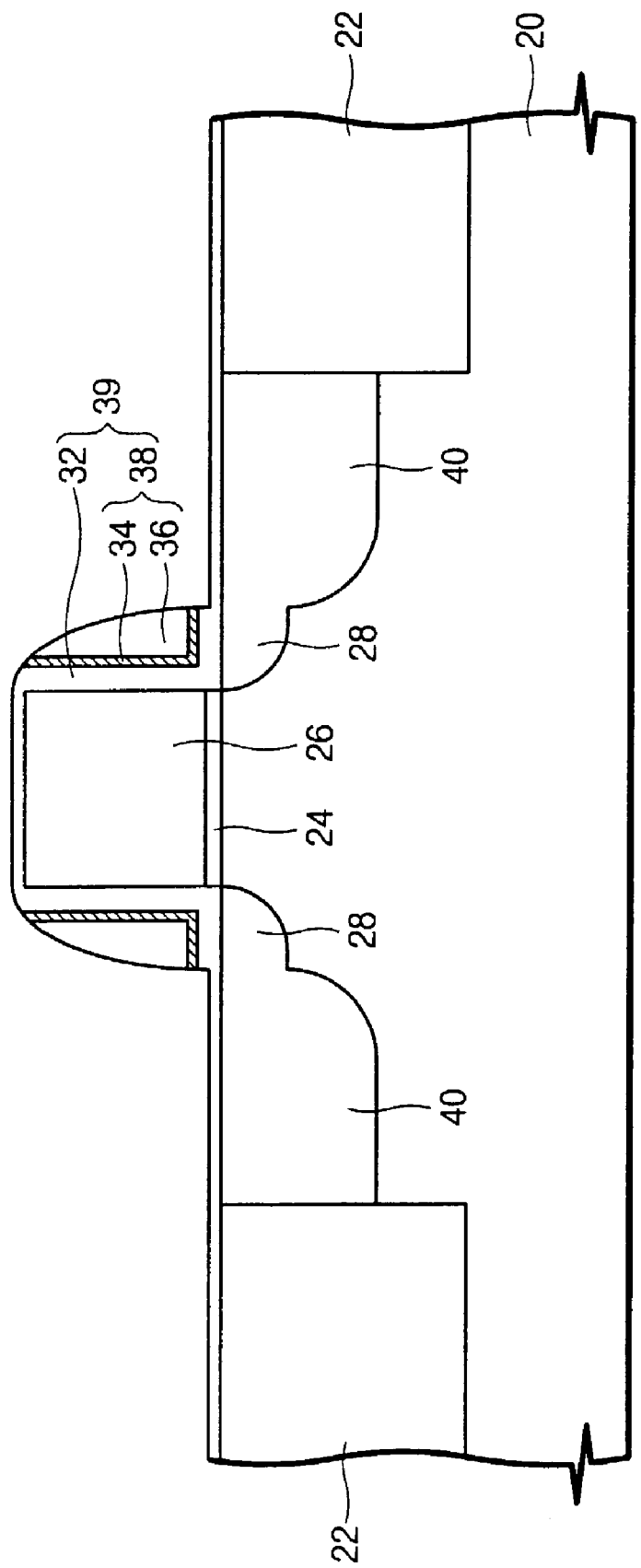

Referring to FIG. 4C, the inner insulation layer 32 and the outer insulation layer 38 are patterned by dry etching using an anisotropic etch process, thereby forming a gate spacer 39 on the sidewalls of the gate electrode 26. Accordingly, the gate spacer 39 includes the patterned inner insulation layer 32 and the patterned outer insulation layer 38. The patterned outer insulation layer 38 includes the patterned first outer insulation layer 34 and the second outer insulation layer 36. The inner insulation layer 32 is not completely removed by the dry etch and a thin layer of about 50 Ångstroms may remain on the surface of the substrate. A heavily doped region 40 is formed by ion implantation using the gate electrode 26, the gate spacer 39, and the field region 22 as an ion implantation mask. The inner insulation layer 32 remaining on the substrate can serve as a buffer layer during the ion implantation.

Figure 4D:
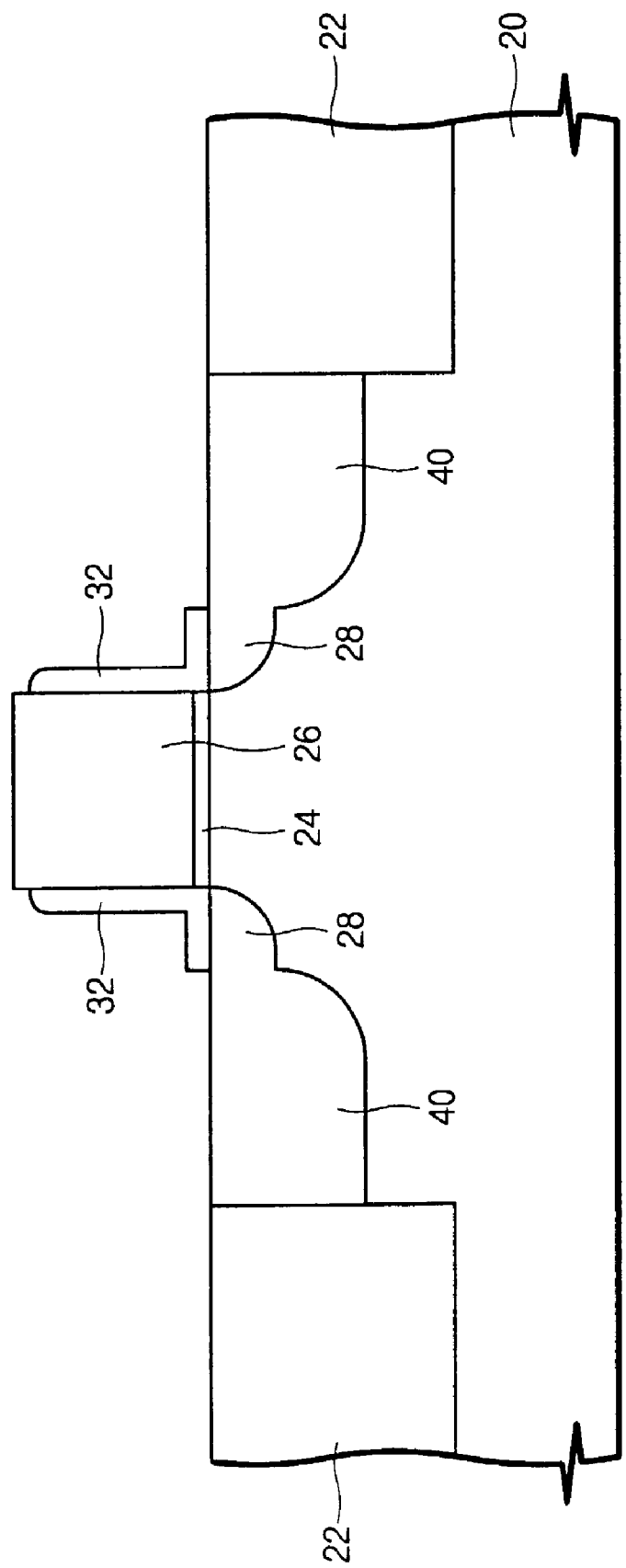

Referring to FIG. 4D, the patterned outer insulation layer 38 constituting the gate spacer 39 is removed using a wet etch process. Thus, forming the L-shaped spacer 32 including the patterned inner insulation layer. The L-shaped spacer 32 includes I-shaped main portion and a projecting portion that extends from a bottom (or base) of the I-shaped main portion. Unlike some of the other embodiments disclosed herein (such as those disclosed in reference to FIG. 3D, the L-shaped spacer 32 includes only the inner insulation layer 32.

Figure 4E:
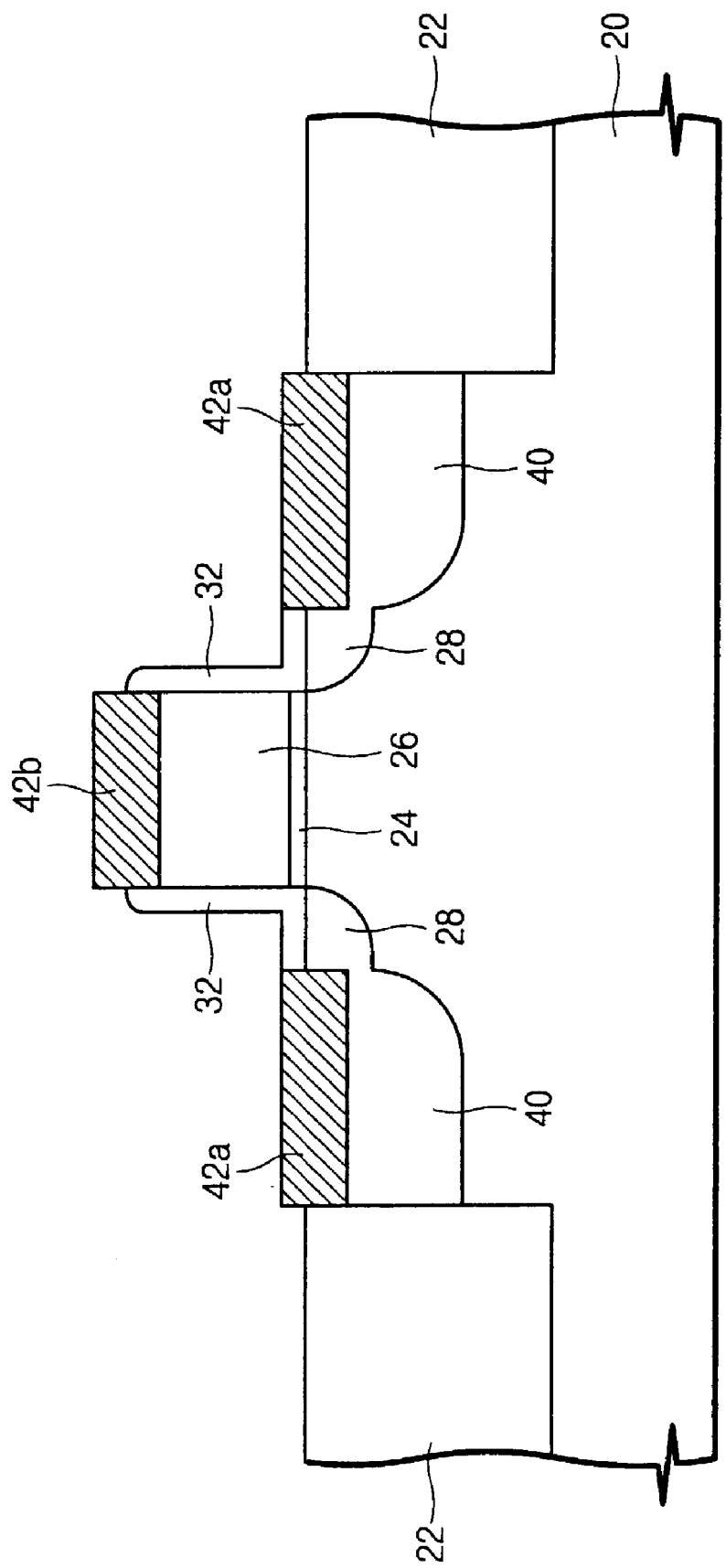

Referring to FIG. 4E, a Salicide process is applied to a surface of the heavily doped region 40 and to a top of the gate electrode 26, to form a first silicide layer 42a and a gate silicide layer 42b. The gate silicide layer may not be formed on the gate electrode 26 depending on the materials constituting the gate electrode 26.

Figure 4F:
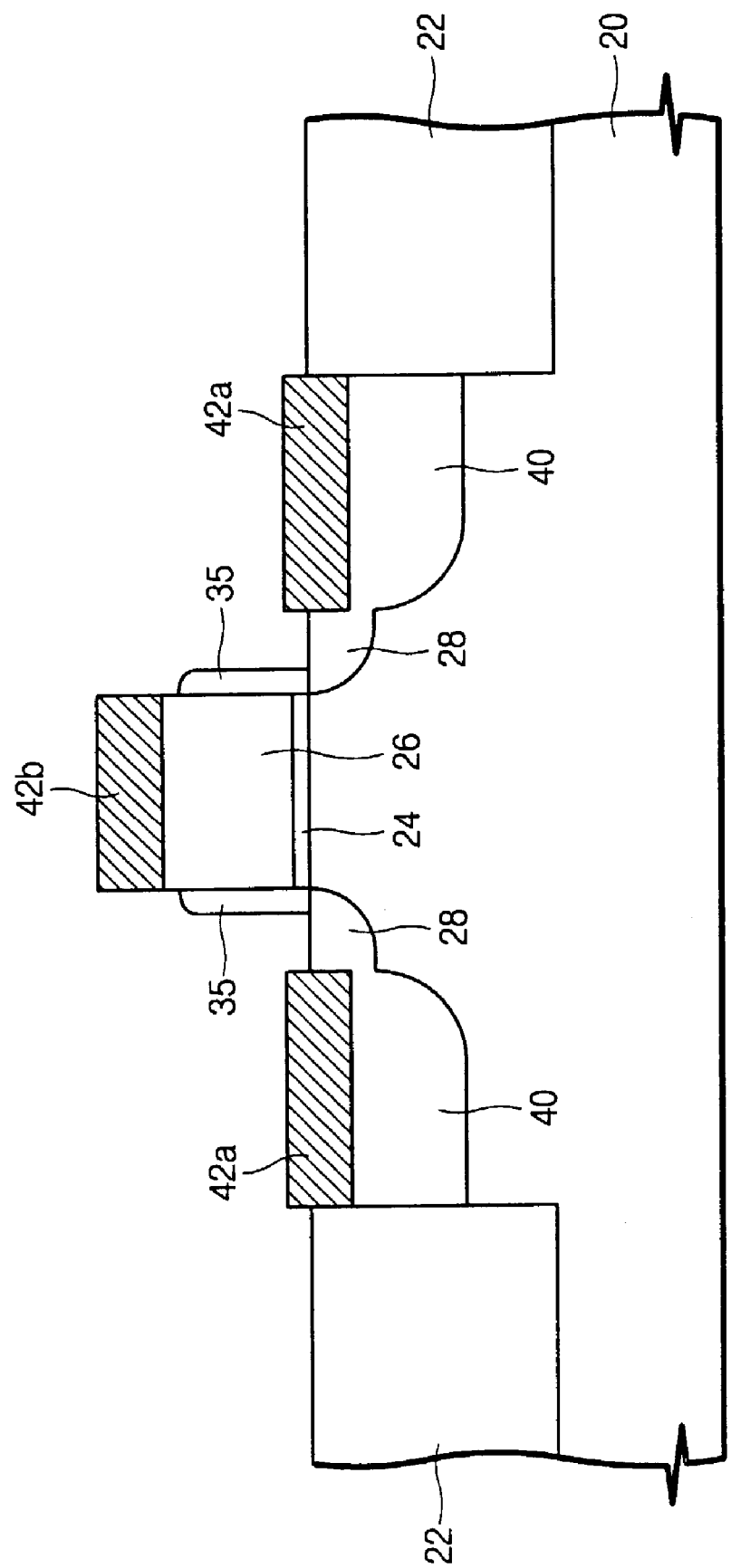

Referring to FIG. 4F, the L-shaped spacer 32 is dry etched to remove the portion of the L-shaped spacer 32 that projects from the base to expose a partial surface of the lightly doped region 28 and to form an I-shaped spacer 35. Therefore, in some embodiments according to the present invention disclosed herein (such as in reference to FIG. 3F), the etching process used to remove the projecting portion of the L-shaped spacer 32 is a dry etch process rather than a wet etch process. Furthermore, in the present embodiment according to the present invention, the insulating spacer disclosed in reference to other embodiments can be eliminated. Accordingly, if the wet etch process is applied, the L-shaped spacer may be wholly or partially removed. If the L-shaped spacer is wholly removed or the I-shaped spacer is thinly formed on the sidewalls of the gate electrode, a leakage current may be generated through the silicide layer between the gate electrode 26 and the impurity regions 28 and 40.

Figure 4G:
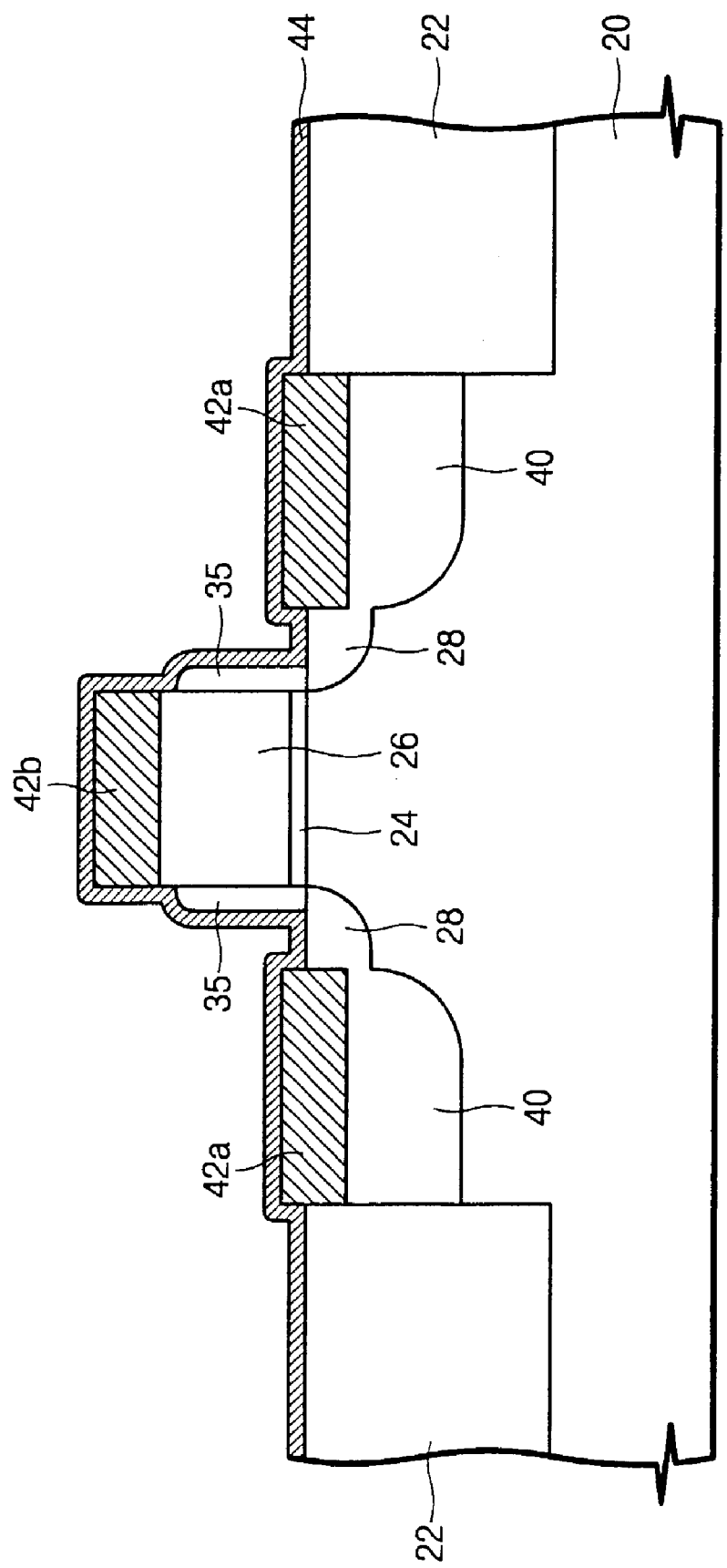

Referring to FIG. 4G, a metal layer 44 is formed on the surface of the substrate including on at least a portion of the lightly doped region 28. The metal can react with the silicon in the exposed lightly doped region 28. In some embodiments according to the present invention, the reaction between the substrate and the metal occurs naturally (i.e., without a thermal process being applied).

Referring to FIG. 4H, any metal that does not react with the silicon in the substrate is removed to form the thin second silicide layer 46 on the exposed lightly doped region 28. As a result, a resistance of a contact made to the lightly doped region 28 and the heavily doped region 40 can be reduced. In other embodiments according to the present invention, a thermal process can be performed after the second silicide layer 46 is formed to further reduce the resistance.

As set forth before, according to some embodiments of the present invention, when a MOS transistor with an LDD structure is fabricated, a silicide layer can be formed even at a lightly doped region. As a result, a resistance of a source/drain region may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a MOS transistor comprising:
   forming lightly and heavily doped source/drain regions adjacent to one another in a substrate having a gate electrode with a sidewall spacer thereon;
   saliciding a surface of the heavily doped source/drain region to provide a first silicide layer self-aligned to the sidewall spacer;
   removing at least a portion of the sidewall spacer to expose a portion of the lightly doped source/drain region adjacent to the first silicide layer; and
   saliciding the exposed portion of the lightly doped source/drain region to provide a second silicide layer between the first silicide layer and the gate electrode.

2. The method according to claim 1 wherein forming lightly and heavily doped source/drain regions comprises:
   forming an I-shaped sidewall spacer on the gate electrode; and
   forming an L-shaped sidewall spacer including a first portion on the I-shaped sidewall spacer having a base portion on the substrate and a second portion that extends on the substrate from the base away from the gate electrode.

3. The method according to claim 1 wherein forming lightly and heavily doped source/drain regions comprises:
   forming an L-shaped sidewall spacer including a first portion on the sidewall of the gate electrode having a base portion on the substrate and a second portion that extends on the substrate from the base away from the gate electrode.

4. The method according to claim 2 wherein the step of removing at least a portion of the sidewall spacer comprises removing the L-shaped spacer.

5. The method according to claim 1 wherein the first and second silicide layers comprise separate silicide layers.

6. The method according to claim 1 wherein the step of forming lightly and heavily doped source/drain regions comprises:
forming the lightly doped source/drain region in the substrate self-aligned to the gate electrode;
forming a first spacer on a sidewall of the gate electrode;
forming a second spacer on the first spacer; and
forming the heavily doped source/drain region in the substrate self-aligned to the second spacer.

7. The method according to claim 1 wherein the first and second silicide layers form a continuous silicide layer on the heavily doped source/drain region and on the lightly doped source/drain region.

8. The method according to claim 1 wherein the second silicide layer has a thickness less than that of the first silicide layer.

9. A method of fabricating a MOS transistor comprising:
forming a field region at a substrate to define an active region;
forming a gate electrode on the active region, wherein a gate insulation layer is intervened between the active region and the gate electrode;
forming a lightly doped region in the active region by using the gate electrode and the field region as an ion implantation mask;
forming a gate spacer on sidewalls of the gate electrode, wherein the gate spacer includes a patterned inner insulation layer and a patterned outer insulation layer;
forming a heavily doped region in the active region by using the gate electrode, the gate spacer, and the field region as an ion implantation mask;
removing the patterned outer insulation layer to form an L-shaped spacer on the sidewalls of the gate electrode, wherein the L-shaped spacer is formed of an I-shaped main portion and a projected portion extended from a bottom of the main portion;
forming a first silicide layer on a surface of the heavily doped region adjacent to the L-shaped spacer;
removing the projected portion of the L-shaped spacer to form an I-shaped spacer and to expose a partial surface of the lightly doped region; and
forming a second silicide layer on the exposed lightly doped region.

10. The method as claimed in claim 9, wherein the patterned outer insulation layer is a stack structure of a first outer insulation layer and a second outer insulation layer and the patterned first and second outer insulation layers have different etch rates.

11. The method as claimed in claim 10, wherein the patterned first outer insulation layer is formed of a silicon nitride layer, and the patterned second outer insulation layer is formed of a silicon oxide layer.

12. The method as claimed in claim 10, wherein the patterned second outer insulation layer is formed to a thinner thickness than the inner insulation layer.

13. The method as claimed in claim 9, wherein the patterned inner insulation layer is formed of a silicon oxide layer.

14. The method as claimed in claim 9, before forming the gate spacer, further comprising forming an insulating spacer on sidewalls of the gate electrode.

15. The method as claimed in claim 14, wherein the insulating spacer is formed of a silicon oxide layer.

16. The method as claimed in claim 9, wherein forming the gate spacer comprises:
sequentially forming an inner insulation layer and an outer insulation layer on an entire surface of the substrate including the gate electrode; and
successively patterning the outer insulation layer and the inner insulation layer by dry etching using an anisotropic etch process,
wherein a portion of the inner insulation layer remains on the substrate.

17. The method as claimed in claim 16, wherein the remaining inner insulation layer has a thickness of about 50 Å.

18. The method as claimed in claim 9, wherein the patterned outer insulation layer is removed using a wet etch process.

19. The method as claimed in claim 9, wherein forming the first silicide layer comprises:
forming a metal layer on an entire surface of the substrate including the heavily doped region;
applying a thermal process to the metal process to allow the metal to react on the heavily doped region; and
removing the unreacted metal from the metal layer.

20. The method as claimed in claim 19, further comprising applying a thermal process to the first silicide layer.

21. The method as claimed in claim 20, wherein the metal layer is formed of one selected from the group consisting of cobalt (Co), titanium (Ti), nickel (Ni), tungsten (W), platinum (Pt), hafnium (Hf), and palladium (Pd).

22. The method as claimed in claim 21, wherein in the case that the metal layer is formed of cobalt, removing the unreacted metal is performed by wet etching using a mixed solution of sulfuric acid ($H_2SO_4$), oxygenated water ($H_2O_2$), and water ($H_2O$).

23. The method as claimed in claim 20, wherein forming the second silicide layer on the lightly doped region comprises:
depositing a metal layer on an entire surface of the substrate including the lightly doped region;
forming a natural silicide layer between the lightly doped region and the metal layer; and
removing the unreacted metal from the metal layer.

24. The method as claimed in claim 23, wherein the metal layer is formed of one selected from the group consisting of cobalt (Co), titanium (Ti), nickel (Ni), tungsten (W), platinum (Pt), hafnium (Hf), and palladium (Pd).

25. The method as claimed in claim 23, further comprising applying a thermal process to the second silicide layer.

26. The method as claimed in claim 19, wherein the gate electrode is formed of at least one selected from the group consisting of impurity doped polysilicon, silicon germanium (SiGe), cobalt (Co), tungsten (W), titanium (Ti), nickel (Ni), tantalum (Ta), titanium nitride (TiN), tantalum nitride (TaN), and tungsten nitride (WN).

27. The method as claimed in claim 19, further comprising forming a gate silicide layer at a top of the gate electrode.

28. The method as claimed in claim 19, wherein the second silicide layer is formed to a thinner thickness than the first silicide layer.

* * * * *

UNITED STATES PATENT AND TRADEMARK OFFICE
CERTIFICATE OF CORRECTION

PATENT NO. : 7,211,515 B2 Page 1 of 1
APPLICATION NO. : 10/388354
DATED : May 1, 2007
INVENTOR(S) : Lee et al.

It is certified that error appears in the above-identified patent and that said Letters Patent is hereby corrected as shown below:

On Title Page:

Item (57), Line 6 and 11: Please correct "suicide"
To read -- silicide --

Signed and Sealed this

Fourteenth Day of August, 2007

JON W. DUDAS
*Director of the United States Patent and Trademark Office*

UNITED STATES PATENT AND TRADEMARK OFFICE
CERTIFICATE OF CORRECTION

PATENT NO.       : 7,211,515 B2
APPLICATION NO.  : 10/388354
DATED            : May 1, 2007
INVENTOR(S)      : Lee et al.

It is certified that error appears in the above-identified patent and that said Letters Patent is hereby corrected as shown below:

On Title Page:

Item (57), Line 6 and 11: Please correct "suicide"
                          To read -- silicide--

Signed and Sealed this

Twenty-eighth Day of August, 2007

JON W. DUDAS
*Director of the United States Patent and Trademark Office*